(12) United States Patent
Bayar et al.

(10) Patent No.: US 11,031,912 B2
(45) Date of Patent: Jun. 8, 2021

(54) SELF-OPTIMISING RF AMPLIFIER

(71) Applicant: ETL SYSTEMS LIMITED, Herefordshire (GB)

(72) Inventors: Esen Bayar, Northwood (GB); Graham Quintal, Middlesex (GB)

(73) Assignee: ETL SYSTEMS LIMITED, Hereford (GB)

(*) Notice: Subject to any disclaimer, the term of this patent is extended or adjusted under 35 U.S.C. 154(b) by 0 days.

(21) Appl. No.: 16/307,962

(22) PCT Filed: Jun. 9, 2017

(86) PCT No.: PCT/EP2017/064207
§ 371 (c)(1),
(2) Date: Dec. 7, 2018

(87) PCT Pub. No.: WO2017/212062
PCT Pub. Date: Dec. 14, 2017

(65) Prior Publication Data
US 2019/0222177 A1    Jul. 18, 2019

(30) Foreign Application Priority Data
Jun. 10, 2016  (GB) ..................... 1610197

(51) Int. Cl.
*H03G 3/20*     (2006.01)
*H03F 1/02*     (2006.01)
*H03F 3/189*    (2006.01)
*H03F 1/26*     (2006.01)
*H03F 1/30*     (2006.01)
*H03F 1/32*     (2006.01)
*H03F 3/19*     (2006.01)

(52) U.S. Cl.
CPC ............. *H03F 1/0277* (2013.01); *H03F 1/26* (2013.01); *H03F 1/30* (2013.01); *H03F 1/32* (2013.01); *H03F 3/189* (2013.01); *H03F 3/19* (2013.01); *H03F 2200/111* (2013.01); *H03F 2200/165* (2013.01); *H03F 2200/228* (2013.01); *H03F 2200/451* (2013.01)

(58) Field of Classification Search
CPC ...................................................... H03G 3/20
USPC ................................................. 330/129, 136
See application file for complete search history.

(56) References Cited

U.S. PATENT DOCUMENTS 6,498,534 B1   12/2002  Kim et al.
6,756,843 B2 *  6/2004  Charley .................. H04B 1/04
                                                  330/124 R (Continued)

*Primary Examiner* — Henry Choe
(74) *Attorney, Agent, or Firm* — IPro, PLLC

(57) ABSTRACT

There is provided an RF amplifier arrangement comprising: an input operable to receive an RF input signal; an output operable to output an amplified RF signal; at least one amplifier bank located between the input and output, the or each amplifier bank comprising a plurality of amplifier stages; an input level detector operable to measure the signal level of the RF input signal; and a controller operable to control the amplifier bank, wherein the controller is operable to select one or more different configurations of the amplifier by selecting one or more amplifier stages and/or modifying one or more characteristics of one or more amplifier stages in dependence upon the signal level of the RF input signal to dynamically adapt and optimise its characteristics.

21 Claims, 6 Drawing Sheets

(56) References Cited

U.S. PATENT DOCUMENTS

| | | | |
|---|---|---|---|
| 6,812,789 B2 * | 11/2004 | Mackey | H03G 1/007 330/129 |
| 7,474,149 B2 * | 1/2009 | Snelgrove | H03F 1/0205 330/129 |
| 8,598,950 B2 * | 12/2013 | Khesbak | H03F 1/56 330/51 |
| 8,981,846 B2 * | 3/2015 | Wimpenny | H03F 1/0227 330/129 |
| 9,281,786 B2 * | 3/2016 | Kovac | H03F 1/0277 |
| 2002/0097087 A1 * | 7/2002 | Petz | H03F 1/0277 330/124 R |
| 2003/0102911 A1 | 6/2003 | Raghavan et al. | |
| 2004/0012441 A1 * | 1/2004 | Mackey | H03G 1/007 330/129 |
| 2010/0321108 A1 * | 12/2010 | Lee | H03G 3/3042 330/131 |
| 2011/0298519 A1 * | 12/2011 | Liu | H03K 3/356113 327/333 |
| 2012/0071120 A1 | 3/2012 | Pinarello et al. | |
| 2012/0206201 A1 | 8/2012 | Mizokami et al. | |
| 2015/0035593 A1 | 2/2015 | Kovac | |

\* cited by examiner

SELF-OPTIMISING RF AMPLIFIER

The present invention relates to a self-optimising RF amplifier. More preferably, the present invention relates to an RF amplifier which is dynamically adjustable to account for characteristics of an input signal.

Radio frequency (RF) Amplifiers are well known in the art. An RF amplifier is an electronic amplification device which is used to convert an incoming low-power signal into a larger signal, typically for driving the antenna of a transmitter and maintaining receive signal levels. Typically, RF amplifiers are utilised either on the transmitter (Tx) side to amplify a signal prior to transmission or on the receiver (Rx) side to amplify a received signal.

Commonly, RF amplifiers operate over a broad frequency spectrum covering the frequency range from low VHF/UHF frequencies to millimetric wavelengths and beyond. Most commonly includes the bands denoted as L and S-bands (0.8 to 2.8 GHz), C and X-bands 3.4 to 8 GHz), Ku and Ka bands 9 to 40 GHz).

In many cases, a RF amplifier may be required to operate across a broad range of signal strengths. An example of this may be in satellite communications where a satellite is in an elliptical orbit such that the signal strength between the satellite and a ground station changes markedly during an orbit.

Therefore, a key parameter of an RF amplifier is the available dynamic operational range. This is determined by the minimum and maximum signal levels that the RF amplifier is operable to process effectively in line with its required performance parameters.

At low signal strengths, the operational range of an amplifier is governed by noise levels and the strength of the undesired noise power, primarily the strength of the in-band noise. The level of in-band noise is often dictated by the amplifier's Noise Figure.

Noise Figure (NF) is a measure of the electrical noise (N) which an active device such as a transistor generates within itself when amplifying a signal (S), and is defined as:

$$NF = 10 \log\left(\frac{Sinput/Ninput}{Soutput/Noutput}\right) dB \quad (1)$$

An ideal amplifier will introduce no noise, such that the ratio S input/N input is the same as S output/N output. Substituting into equation (2):

$$NF = 10 \log\{1\} = 0 \text{ dB} \quad (2)$$

Practical amplifiers fall far short of the ideal transistor—they will always introduce unwanted noise into the system and this can have a critical impact on receiver sensitivity. Therefore when receiving low level signals it is desirable to have a low noise figure.

Conversely, at high signal strengths, the limitations of an RF amplifier are governed by distortions resulting from nonlinear behaviour and spurii levels. These distortions are generated by the active devices within the amplifier module itself handling the signal being amplified.

A further issue related to the linearity of a signal is intermodulation. Intermodulation is signal distortion which occurs when multiple large signals are fed into an amplifier. The general formula to calculate an intermodulation figure is given by equation (3):

$$OIPn = Pout + \frac{dBc}{(n-1)} dBm \quad (3)$$

where OIPn is the intermodulation intercept point, $P_{out}$ is the power of the fundamental signal, dBc is the difference between the fundamental and the intermodulation product and n is the desired product.

For many applications, the third order products are of interest because these fall within the operational bandwidth and, therefore, cannot be filtered out. This is shown in FIG. 8. This yields the following equation (4) below:

$$OIP3 = Pout + \frac{dBc}{(2)} dBm \quad (4)$$

In applications where the operational bandwidth is octave or larger, i.e. the cases where the higher operational frequency is twice the lower operational frequency or larger, the second order intermodulation products become as important as those of third order.

Again for the same reason, that is the second order products fall in band and cannot be filtered out.

A level change of the two sinusiodal carriers at the input of Δ dB causes the level of the associated intermodulation product to change by n×Δ dB, as shown in FIGS. 8 and 9.

It should be noted in most communication applications where RF signal are used the levels of intermodulation products with respect to the fundamental is a figure of merit. It defines the extent of distortion and how much an amplifier deviates from linear operation and how badly the output signal is distorted.

The saturation, or compression point, of an amplifier determines the maximum signal level that can be handled by the amplifier. Once an amplifier is in compression it is no longer operating in its linear region and intermodulation distortion will become more prominent as the amplifier goes deeper into compression.

For high level signals, it is desirable to have a high OIP3, ensuring that there is ample head room, and the signal is well backed off from its non-linear region. Conversely, a low amplitude signal will not compress the amplifier, but the signal quality is more sensitive to noise, and so noise figure is more critical.

Ideally, a low noise figure and a high linearity is desirable. However, when designing RF systems, a trade-off between NF and linearity is necessary since these characteristics cannot generally all be optimised in the same device.

In addition, most active parts in most amplifier line-ups, for example: active attenuators; switches; phase shifters; and peripheral control circuitry also influence the operational range.

Various arrangements to improve the dynamic operation range of an amplifier are known. One such class of device comprises linearisers, or pre-distortion techniques. This approach extends the dynamic operational range at high input signal strengths by alleviating effects of distortions. At low input signal levels, correlation and Digital Signal Processing techniques are used to extend the weak signal limitations, enabling recovery of signal levels even if they are virtually buried into the noise floor.

However, these arrangements are limited in that they are focussed on one particular region of the strength spectrum. Thus, these arrangements are not adaptable across a wide dynamic range. Therefore, a technical problem exists in the art that known solutions to improved dynamic range for amplifiers are limited. The present invention addresses, in one aspect, the above issues.

According to a first aspect of the present invention, there is provided an RF amplifier arrangement comprising: an input operable to receive an RF input signal; an output operable to output an amplified RF signal; at least one amplifier bank located between the input and output, the or each amplifier bank comprising a plurality of amplifier stages; an input level detector operable to measure the signal level of the RF input signal; and a controller operable to control the amplifier bank, wherein the controller is operable to select one or more different configurations of the amplifier by selecting one or more amplifier stages and/or modifying one or more characteristics of one or more amplifier stages in dependence upon the signal level of the RF input signal.

By providing such an arrangement, the behaviour of the amplifier stage is governed by the input signal strength. Thus, the operational characteristics of the amplifier stage are dynamically adapted to the input signal strength.

In one embodiment, the arrangement further comprises a switch network for selectively connecting the plurality of amplifier stages of each amplifier bank to define the plurality of different configurations, and wherein the controller is operable to control the switching network to select one or more configurations in dependence upon the signal level of the RF input signal.

In one embodiment, the selected amplifier stages may be connected in parallel or in a cascading arrangement.

In one embodiment, at least some of the amplifier stages have different characteristics selected from the group of: Noise Figure; and linearity point. In embodiments, these different characteristics of the amplifier stages can be selected to give an overall desired Noise Figure value and/or linearity characteristic of the entire RF amplifier arrangement.

In one embodiment, the controller is operable to select one or more configurations of the amplifier by modifying one or more characteristics of one or more amplifier stages, the characteristics being selected from the group of: quiescent point or bias of the amplifier stage.

In one embodiment, the arrangement further comprises an output level detector operable to detect the signal level of the output RF signal.

In one embodiment, the controller is further operable to select one or more configurations of the amplifier in dependence upon the signal level of the output RF signal.

In one embodiment, a plurality of amplifier banks is provided, each amplifier bank comprising a plurality of amplifier stages.

In one embodiment, a switch network is provided for each amplifier bank.

In one embodiment, an intermediate detector operable to detect the signal level of an intermediate amplified signal between the first amplifier bank and a second amplifier bank, and wherein the controller is further operable to select one or more configurations of the amplifier in dependence upon the intermediate amplified signal.

In one embodiment, each configuration of amplifier stage corresponds to a particular input signal level or a band of input signal levels.

In one embodiment, each configuration is selected to minimise the Noise Figure of the amplifier at low signal levels and/or to maximise the linearity characteristics of the amplifier at high signal levels.

In one embodiment, each configuration is selected to define a particular profile of Noise Figure and/or linearity characteristics with increasing signal level.

In one embodiment, the plurality of different configurations is stored in a memory of the controller.

In one embodiment, the plurality of different configurations is stored in look up table in a memory of the controller.

In one embodiment, the plurality of different configurations is selected utilising pre-determined thresholds and/or comparators.

In one embodiment, when the detected input signal diverges from the particular input signal level or band of input signal levels for a given configuration, the controller is operable to switch the amplifier arrangement to a different configuration.

In one embodiment, the controller is operable to apply a dynamically controlled hysteresis function to at least some of said amplifiers to avoid jitter effects.

In one embodiment, the controller is operable to apply a time delay to the input signal during the transition between configurations.

In one embodiment, the arrangement further comprises environmental detection means operable to measure one or more of: temperature; humidity; altitude and vibration.

In one embodiment, the input level detector is operable to measure the signal level of the RF input signal at one or more discrete frequencies and/or one or more discrete frequency bands.

In one embodiment, the input level detector is operable to measure the signal level of the RF input signal at a plurality of different discrete frequencies and/or a plurality of different discrete frequency bands.

In one embodiment, the input level detector is operable to isolate one or more frequencies and/or one or more frequency bands and to determine the signal level thereof.

In one embodiment, the input level detector comprises a local oscillator operable to generate a predetermined frequency and a mixer operable to output either the summed frequency or the frequency difference between the local oscillator and the input signal to select a discrete frequency or frequency band.

In one embodiment, the input level detector further comprises a bandpass filter to enable selection of a discrete frequency or frequency band for measurement.

In one embodiment, the local oscillator is operable to generate one or more frequencies to enable the signal level of one or more frequencies and/or one or more frequency bands of the input signal to be determined.

In one embodiment, the controller is operable to apply slope correction to the input signal.

In one embodiment, the slope correction is determined based upon the signal level of one or more discrete frequencies and/or one or more discrete frequency bands of the input signal.

In one embodiment, the input signal is sampled to determine its characteristics, for example its level against frequency, and the data is used to dynamically control and compensate undesired slope effects. The slope correction function is either an integral part of an amplifier stage or external and located anywhere within the amplifying equipment line up. One approach is to down convert the sampled input signal to pre-determined fixed IF frequency for level detection. Down conversion can be realised using synthesised oscillators and band pass filters could ensure accurate detection by filtering out undesired RF components.

According to a second aspect of the present invention, there is provided a method of controlling an RF amplifier arrangement comprising an input operable to receive an RF input signal, an output operable to output an amplified RF signal, at least one amplifier bank located between the input and output, the or each amplifier bank comprising a plurality of amplifier stages, and a controller, the method comprising the steps of:

a) detecting the signal level of the RF input signal; and b) selecting one or more different configurations of the amplifier by selecting one or more amplifier stages and/or modifying one or more characteristics of one or more amplifier stages in dependence upon the signal level and/or characteristics of the RF input signal.

In one embodiment, the RF amplifier arrangement further comprises a switch network for selectively connecting the plurality of amplifier stages of each amplifier bank to define the plurality of different configurations, and wherein step b) further comprises: controlling the switching network to select one or more configurations in dependence upon the signal level of the RF input signal.

In one embodiment, the selected amplifier stages may be connected in parallel or in a cascading arrangement.

In one embodiment, at least some of the amplifier stages have different characteristics selected from the group of: Noise Figure; and linearity point. In embodiments, these different characteristics of the amplifier stages can be selected to give an overall desired Noise Figure value and/or linearity characteristic of the entire RF amplifier arrangement.

In one embodiment, step b) comprises: selecting one or more configurations of the amplifier by modifying one or more characteristics of one or more amplifier stages, and the characteristics are selected from the group of: quiescent point or bias of the amplifier stage.

In one embodiment, prior to step b): c) detecting the signal level of the output RF signal; and wherein step b) further comprises: selecting one or more configurations of the amplifier in dependence upon the signal level of the output RF signal.

In one embodiment, a plurality of amplifier banks is provided, each amplifier bank comprising a plurality of amplifier stages.

In one embodiment, a switch network is provided for each amplifier bank.

In one embodiment, prior to step b), the method further comprises the step of: d) detecting the signal level of an intermediate amplified signal between a first amplifier bank and a second amplifier bank, and wherein step b) further comprises select one or more configurations of the amplifier in dependence upon the intermediate amplified signal.

In one embodiment, each configuration of amplifier stage corresponds to a particular input signal level or a band of input signal levels.

In one embodiment, each configuration is selected to minimise the Noise Figure of the amplifier at low signal levels and/or to maximise the linearity characteristics of the amplifier at high signal levels.

In one embodiment, the plurality of different configurations is stored in a memory of the controller.

In one embodiment, the plurality of different configurations is stored in look up table in a memory of the controller.

In one embodiment, plurality of different configurations is selected utilising pre-determined thresholds and/or comparators.

In one embodiment, when the detected input signal diverges from the particular input signal level or band of input signal levels for a given configuration, the method further comprises: e) switching the amplifier arrangement to a different configuration.

In one embodiment, step e) further comprises: f) applying a dynamically controlled hysteresis function to at least some of said amplifiers to avoid jitter effects.

In one embodiment, step e) further comprises: g) applying a time delay to the input signal during the transition between configurations.

In one embodiment, the method further comprises: h) measuring one or more of: temperature; humidity; altitude; and vibration; and i) utilising said measurement to select configurations in step b).

In one embodiment, the step of detecting the input level comprises measuring the signal level of the RF input signal at one or more discrete frequencies and/or one or more discrete frequency bands.

In one embodiment, the step of detecting the input level comprises measuring the signal level of the RF input signal at a plurality of different discrete frequencies and/or a plurality of different discrete frequency bands.

In one embodiment, the step of detecting the input level comprises isolating one or more frequencies and/or one or more frequency bands to determine the signal level thereof.

In one embodiment, the step of detecting comprises generating a predetermined frequency using a local oscillator and outputting either the summed frequency or the frequency difference between the local oscillator and the input signal using a mixer to select a discrete frequency or frequency band.

In one embodiment, the input level detector further comprises a bandpass filter to enable selection of a discrete frequency or frequency band for measurement.

In one embodiment, the local oscillator is operable to generate one or more frequencies to enable the signal level of one or more frequencies and/or one or more frequency bands of the input signal to be determined.

In one embodiment, the method further comprises: applying slope correction to the input signal.

In one embodiment, the method further comprises determining the slope correction based upon the signal level of one or more discrete frequencies and/or one or more discrete frequency bands of the input signal.

Embodiments of the present invention will now be described in detail with reference to the accompanying drawings, in which.

The present invention relates to a self-optimised radio frequency (RF) Amplifier where the behaviour of the amplifying equipment is dynamically varied to optimise the signal handling characteristics. This provides improved performance over a much greater signal power range.

The invention is based on detection of the input signal level, which is then processed to change the amplifier characteristics to best suit the operational requirements of the apparatus. There are three basic steps to the process: detection of the incoming signal, selection of the operational mode of the amplifier, and the modification of the RF characteristics of the amplifier equipment. The combination of these three steps and the manner in which the controller is programmed enables extension of the dynamic range.

The invention is particularly applicable to transmitter/receiver configurations requiring "mission critical" capability. For example, the ability to switch between modes and characteristics enables efficient operation at low signal levels (where noise is minimised) and also at high signal levels (where linearity is maximised). In addition, the ability to switch between components provides redundancy within the operational system and allows use for both receiver and transmitter applications.

The present invention provides a dynamic optimisation of an amplifier's operational input power range as described below.

Figure 1A:
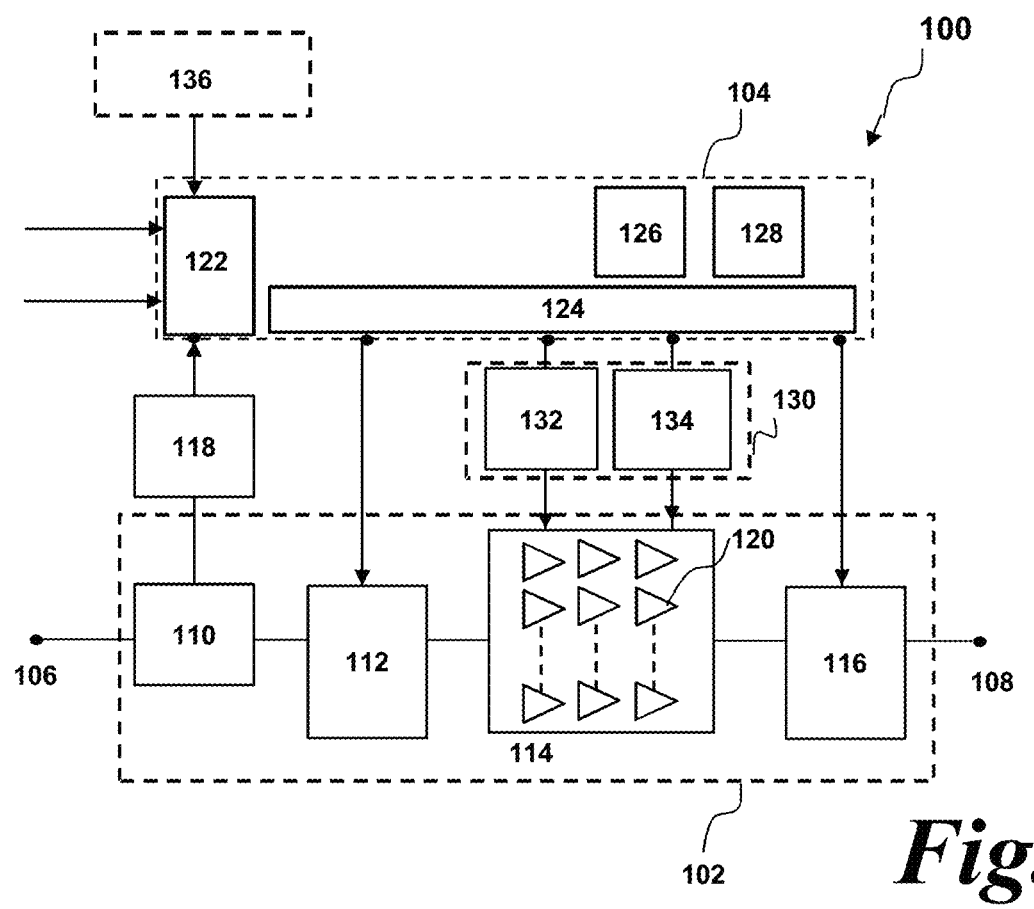
FIG. 1A is a functional block diagram of an RF amplifier arrangement according to a first embodiment of the present invention.

FIG. 1A shows a general schematic configuration of an RF Amplifier arrangement 100 according to a first embodiment of the present invention.

The RF amplifier arrangement 100 comprises an amplifier module 102 and a controller 104.

The amplifier module 102 comprises an input port 106 and an output port 108. The input port 106 is operable to receive an input signal $S_i$ having a signal power Pi and the output 108 is operable to provide an amplified output signal $S_o$. The amplifier module 102 further comprises a coupler 110, an input switch network 112, an amplifier bank 114 and an output switch network 116 connected between the input and output ports 106, 108.

The coupler 110 is, in this embodiment, a passive direction and/or proximity coupler. The coupler 110 enables a coupled port (not shown) to be provided for RF monitoring over the utilised frequency ranges. In other words, the coupler 110 is operable to sample the input signal $S_i$ prior to the input signal $S_i$ being input to the input switch network 112. In this embodiment, the coupled port is connected to an RF detector 118.

The RF detector 118 is operable to sample the input signal $S_i$ at the input port 106 and determine therefrom the input signal power $P_i$ and other properties of the sampled input signal Si as required before the signal $S_i$ is input into the controller 104 as will be described later.

In non-limiting embodiments, the detector 118 may also be operable to control and optimise the signal level as a function of frequency of the described embodiment. This may, for example, comprise the utilisation of a slope correction function. The slope correction function may either be an integral part of one or more amplifier stages or a separate functional block along the RF path within the amplifier module 102.

One possible implementation of this approach is to down-convert the sampled input signal Si to one or more pre-determined fixed spot frequencies or frequency bands for level detection. Such down-conversion can be implemented utilising synthesised oscillators and band pass filters to enable accurate detection by filtering out undesired RF components.

Figure 1B:
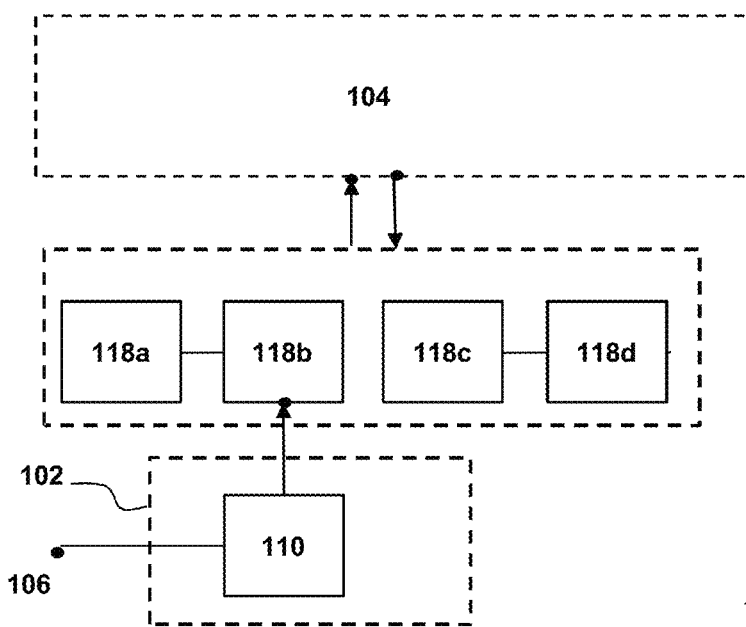
FIG. 1B is a functional block diagram of an alternative or additional input detector according an embodiment.

One example of a detector 118 configured for detection of signal/frequency characteristics is the arrangement shown in FIG. 1B. In FIG. 1B, the detector 118 comprises functional blocks, integral or external to the detector 118, which are operable to facilitate frequency-specific level detection. In FIG. 1B, a synthesised local oscillator 118a is provided in conjunction with an RF mixer 118b to convert the sampled frequency to a predetermined fixed intermediate frequency for detection. The intermediate frequency signal is filtered by a band pass filter 118c prior to level detection by a detector module 118d. This approach enables all sampled signals, of differing frequencies, to be measured at the same intermediate frequency, providing improved accuracy. By way of explanation, the embodiment of detector 118 shown in FIG. 1B functions as follows:

Firstly, the input signal Si is received at input 106 and is sampled by the detector 118. The input signal Si has a particular bandwidth and frequency distribution. The bandwidth is detected or predetermined/known in advance. The local oscillator 118a is then set to the same or similar bandwidth, and with a frequency distribution offset from that of the input signal Si.

For example, the input signal Si may have a frequency range from 2-2.5 GHz (2000-2500 MHz), whereas the local oscillator may have a frequency of 1.5-2 GHz (1500-2000 MHz) with IF frequency fixed at 500 MHz.

The RF mixer 118b is operable to either heterodyning, that is the RF mixer 118b is operable to either sum or difference the input signal Si and the output from the local oscillator 118a. In general, it is more straightforward to process lower frequencies so, in this embodiment, the difference is taken. Therefore, in the example described above, the output from the RF mixer 118b will be at a fixed frequency of 500 MHz.

The band pass filter 118c then filters the output to enable level detection at a predetermined frequency, for example, 500 MHz.

The local oscillator 118a is then operable to change frequency (either step up or step down) by a predetermined amount; for example, 100 KHz or 1 MHz, depending upon the resolution required. This allows the detector 118 to sample the signal level across all the frequencies of the input signal Si.

This arrangement may be used in any one of the embodiments of FIGS. 1A to 6. However, it is also to be understood that this arrangement is optional and a determination of the signal level for the whole or part of the input signal (i.e. not as a function of frequency) may be carried out as required.

The amplifier bank 114 may take the form of a modular chassis into which amplifier stages may be inserted as required. The amplifier bank 114 comprises a plurality of amplifier stages 120. The amplifier stages 120 may take any suitable form. In the context of the present invention, they may take the form of externally powered line amplifiers or RF cable powered amplifiers covering the L-, S-, C-, X-, Ku and Ka-frequency bands. However, alternative arrangements may be used. The skilled person would readily be aware of the type and configuration of devices suitable for use in the arrangement and method of the present invention.

The amplifier stages 120 may be connected in any suitable configuration as required, for example, in parallel or in a cascading arrangement. By connecting the amplifier stages 120 in parallel, the input load can be shared across multiple amplifiers.

The input switch network 112 and an output switch network 116 determine which amplifier stages 120 are switched in and out of the amplifier bank 114. In other words, the path and number of amplifier stages 120 that the RF input signal Si travels through to the output port 108 is determined, in part, by the switch networks 112, 116.

The controller 104 enables control of the amplifier module 102. The controller 104 comprises an input interface 122, an output interface 124, a central processing unit (CPU) 126 and a local memory 128.

The input interface 122 is operable to receive inputs to the controller 104 from numerous sources. The controller 104 may be connected to a local controller (not shown) or a remote controller (not shown) operated by a use or automatically. Additionally or alternatively, the controller 104 may comprise an Application Specific Programming Port (not shown) through which particular data elements or programming logic can be implemented on the CPU 126 or stored in the local memory 128.

The RF detector 118 is also connected to the input interface 122 to enable the controller 104 to sample the input signal $S_i$ received at the input port 106 of the amplifier module 102.

The output interface 124 of the controller 104 comprises numerous outputs operable to enable control of the amplifier module 102. In this embodiment, the output interface 124 has outputs operable to control the configuration of the input switch network 112, the output switch network 116 and the amplifier bank 114. The output interface 124 of the controller 104 is operable to control the input switch network 112 and the output switch network 114 and is operable to switch amplifier stages 120 in and out of use as required.

Further, the output interface 124 is operable to control the properties and combination of the amplifier bank 114 utilising an amplifier bank control output 130. The amplifier bank control output 130 comprises, in this embodiment, an amplifier selector 132 and a bias control 134.

The amplifier selector 132 is provided to enable control of the amplifier stages 120 within the amplifier bank 114. For example, the input switch network 112 and the output switch network 116 may be configurable to define the particular path(s) through the amplifier bank 114. However, additionally, the controller 104 is further operable to control the number and properties of the amplifiers 120 along the selected path(s) as will be described later. Therefore, there may be arrangements where the characteristics of the amplifiers 120 are changed by the controller 104 in response to the input signal without changing the switch networks 112, 116.

The controller 104 is operable to utilise a sampled input signal $S_i$ and to control the amplifier bank 114 based thereon. The control mechanism by which the controller 104 is operable to control the amplifier bank 114 will now be described. In this embodiment, the controller 104, via the input and output switch networks 112, 116 and the amplifier bank control output 130, is operable to modify one or both of a) the number of amplifiers 120 operable in the amplifier bank 114 at any one time and b) the operating parameters of one or more amplifiers 120 in the amplifier bank 114.

The RF detector 118 is operable to sample the signal level (i.e. signal power Pi) of the input signal $S_i$. This is then inputted to the controller 104 through the input interface 122. The controller 104 is then operable to control the amplifier bank 114 based on the signal power Pi. The controller 104 may make this determination based on a number of factors. For example, the sampled input signal power/level $P_s$ may be compared to pre-stored values in a look up table (not shown) stored in the local memory 128. Alternatively, the sampled input signal level may be input into a comparator or compared to a predetermined threshold.

Based on the determination of the controller 104, the input and output switch networks 112,116 are controlled to activate particular amplifiers 120 within the amplifier bank 114 or to specify particular characteristics of the amplifier(s) 120.

In addition, the amplifier selector 132 may be utilised to select particular amplifiers 120 along the signal path(s) through the amplifier bank 114. Additionally or alternatively, the amplifier selector 132 may specify particular configurable properties of the selected amplifiers 120.

The bias control 134 is also operable to control the bias of the selected amplifiers 120 to provide the desired characteristics for effective amplification of the input signal Si given the specific signal strength of the input signal Si. The bias control 134 may be also utilised to introduce hysteresis as will be described later.

Similarly, the slope control function is also operable to control the active slope circuits, which may be integral to the amplifier stages or in the RF line up as a separate functional block of the amplification equipment, and provide the desired correction or adjustment to level (or gain) versus frequency characteristics of the described embodiments.

The present invention enables precise and appropriate selection of different components depending upon the required capabilities of the amplifier arrangement 100. For example, for low signal levels, low noise amplifiers 120 may be selected from the group, where the selected components have a low Noise Factor (NF). Alternatively, for high signal levels, the controller 104 may select one or more amplifiers 120 which have high OIP3 values or low intermodulation distortion and harmonic levels.

By switching configurations of the amplifier module 102 in dependence upon at least the input signal level, a large operational range can be provided. For each input signal level (or discrete band of input signal levels) a particular configuration of amplifiers 120 within the amplifier module 102 can be selected to optimise the properties of the amplifier module 102 for that particular input signal level or discrete band of input signal levels. As set out above, at low signal levels, minimising noise (i.e. minimising the overall Noise Figure of the amplifier module 102 between the input and the output) is the dominant requirement for robust signal amplification.

Conversely, as the input signal level increases, then the linearity of the amplifier module 102 (i.e. the overall linearity of the entire amplification system between the input and the output) becomes the dominant requirement. In between these levels, there is of course a trade-off between Noise Figure and linearity which can be obtained by selection of particular configurations of amplifiers 120 within the amplifier module 102.

The exact nature of the trade-off may depend upon the precise requirements of the end application. However, the flexibility of the amplifier of the present invention enables these characteristics to be varied with signal level in any suitable manner. For example, these characteristics may be varied linearly with increasing or decreasing input signal level, or these characteristics may be varied in a discontinuous manner such as a step-change or ramp up/ramp down. The precise variation of these characteristics with input signal level will depend upon the selected configurations of amplifiers 120 within the amplifier module 102 a particular input signal level or discrete band of input signal levels.

By way of example, in applications where the input signal strength changes vastly, a minimum received input signal level may be in the range of −80 dBm to −90 dBm ($1 \times 10^{-12}$ W). Conversely, the input signal level may increase up to, for example, 40 dBm (10 W) in use. Consequently, the amplifier 100 is required to adapt to amplify and output the received input signal with adequate quality and fidelity across a range of more than ten orders of magnitude.

For many suitable applications, at low signal levels a very low Noise Figure value such as sub 1 dB is typically required. Conversely, at high signal levels the amplifier needs to be highly linear to minimise effects of distortion and maintain good fidelity in the output signals with 1 dB Gain Compression Points (GCP) typically in the region of 10 W.

The present invention enables the amplifier apparatus to dynamically adapt across such an extreme range of (potentially fast changing) signal levels and automatically define a new operational region/condition as defined by each amplifier configuration.

As set out above, the controller 104 may be operable to modify the operating characteristics of particular amplifiers 120 within the amplifier bank 114, for example, the quiescent points or bias conditions (using the bias control 134) of the selected amplifiers 120.

Optionally, the configuration of the amplifier bank 114 may be determined based on additional parameters. For example, the input interface 122 may be configured to receive inputs from external sensors. In this regard, an optional sensor module 136 is shown in FIG. 1A. The sensor module 136 may comprise any suitable sensors required to monitor environmental conditions which may affect the operation of the amplifier bank 114.

For example, the sensor module 136 may comprise temperature sensors (thermistors), humidity/moisture sensors, vibration sensors (or accelerometers), radiation sensors, current/power load sensors or other suitable sensors.

Therefore, the control of the amplifier bank 120 by the controller 104 may also be based on information from the sensor module 136 in addition to the strength of the input signal Si.

As a further alternative, a sensor module 136 need not be provided. Instead, environmental conditions may be inputted remotely or locally to the controller 104 through the input interface 122. This may include manually- or automatically-input temperature values or other environmental parameters which are used to control the operation of the amplifier bank 114.

In both cases, the CPU 126 and memory 128 may store and process the measured or inputted environmental factors and use this information to fine-tune the operation of the amplifier arrangement 100 in use. In other words, this facility enables the amplifier arrangement 100 to adapt to particular environmental or operating conditions in use.

When particular amplifiers 120 are switched in or out of the switch network, a discontinuity, jitters or interference in the output signal may result. In order to address this, the controller 104 is operable to utilise a dynamically controlled hysteresis function. In other words, the controller 104 is operable, through the bias control 134, to add positive feedback to a given amplifier 120. This hysteresis will alter the thresholds of each amplifier 120, eliminating or reducing jitters.

Additionally or alternatively, when switching between operational modes, the controller 104 may implement a time delay to minimise glitches in signal transmission through the device and facilitate smooth transition.

Figure 2:
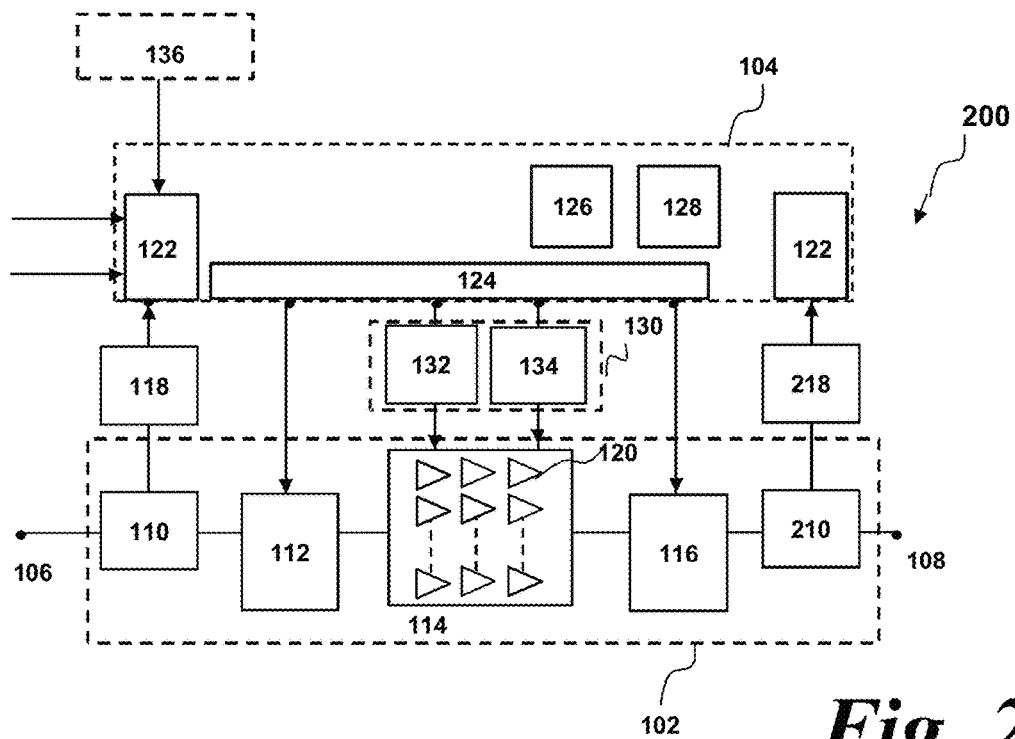
FIG. 2 is a functional block diagram of an RF amplifier arrangement according to a second embodiment of the present invention.

A second embodiment is shown in FIG. 2. The FIG. 2 embodiment shows a more complex RF amplifier arrangement 200. The components of the RF amplifier arrangement 200 in common with those of the RF amplifier arrangement 100 of the first embodiment are shown using the same reference numerals for clarity.

The second embodiment differs from the first embodiment in that the RF signal amplitude is sampled at two different points. In order to effect this, the RF amplifier arrangement 200 comprises a second coupler 210 arranged downstream of the amplifier bank 114 and output switch network 116, but upstream of the output port 108. The second coupler 210 may also comprise a passive direction and/or proximity coupler, and enables a coupled port (not shown) to be provided for RF monitoring over the utilised frequency ranges. In other words, the coupler 210 is operable to sample the amplified output signal $S_o$ prior to the signal being output through the output port 108.

In this embodiment, the coupled port of the coupler 210 is connected to a second RF detector 218. The second RF detector 218 is operable to sample the output signal $S_o$ at upstream of the output port 108 and determine therefrom the output signal amplitude and other properties of the sampled output signal $S_o$ as required. This sampled output signal usually offers better reference for slope correction in applications where slope correction is desired.

This sampled output signal $S_o$ is then inputted to the controller 104 through the input interface 122. The controller 104 is then operable to control the amplifier bank 114 based on the strength of the input signal Si and the properties of the output signal $S_o$.

As for the first embodiment, the controller 104 may make this determination based on a comparison of the sampled input signal power $P_i$ to pre-stored values in a look up table (not shown) stored in the local memory 128. Alternatively, the sampled input signal level may be input into a comparator or compared to a predetermined threshold.

Additionally, the output signal $S_o$ may be compared to expected values for such a signal based on the input signal strength and the required amplification. These comparisons may also be done using, for example, a look up table in the local memory 128 of the controller 104. If the sampled output signal $S_o$ properties deviate from the expected values, then the controller 104 may be operable to modify particular parameter of the amplifier bank 114. For example, the controller 104 may modify properties of the amplifier bank 114 such as the gain of the selected amplifiers 120, or the slope or even the number or type of selected amplifiers 120 to ensure that the output is as expected.

Additionally, as for the first embodiment, environmental signals may also be input into the controller 104 and the amplifier bank 104 controlled in dependence thereon, also.

Figure 3:
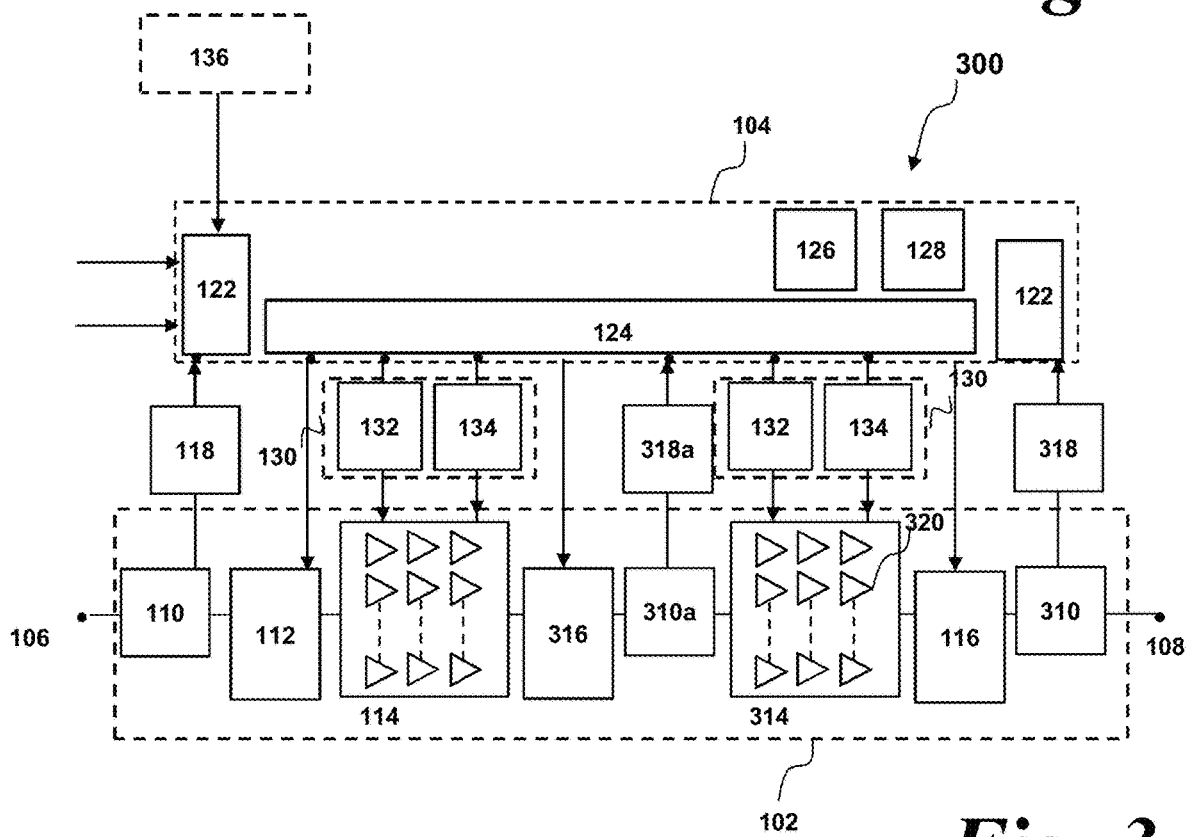
FIG. 3 is a functional block diagram of an RF amplifier arrangement according to a third embodiment of the present invention.

A third embodiment is shown in FIG. 3. The FIG. 3 embodiment shows a more complex RF amplifier arrangement 300. The components of the RF amplifier arrangement 300 in common with those of the RF amplifier arrangement 100 of the first embodiment are shown using the same reference numerals for clarity.

In the third embodiment, three couplers 110, 310, 310a are provided. Additionally, three RF detectors 118, 318, 318a are also provided. The couplers 110, 310 and RF detectors 118, 318 are operable, as for the second embodiment, to sample the input, output signals $S_i$, $S_o$ respectively.

However, in the third embodiment, two separate amplifier banks 114, 314 are provided. Therefore, this provides for the possibility of sampling the amplified signal at an intermediate stage between the two amplifier banks 114, 314. Therefore, the coupler 310a and RF detector 318a are provided in order to sample the amplified signal after the first amplifier bank 114 and prior to the second amplifier bank 314. However, this additional stage of sampling of the signal is optional and may be omitted.

In order to able to switch the amplifier banks 114, 314 appropriately, three switch matrices are required—an input switch matrix 112, an output switch matrix 116 (as for the first and second embodiments) and an intermediate switch matrix 316.

In addition, each bank of amplifiers 114, 314 has a respective amplifier bank control output 130, 330. Each amplifier bank 114, 314 comprises amplifier stages 120, 320 respectively. The amplifier bank control output 130, 330 comprises, in this embodiment, a respective amplifier selector 132, 332 and bias controller 134, 334.

The possibility of switching two or more amplifier banks 114, 314 in or out of operation in dependence upon the input signal level provides for numerous benefits. This enables combinations of amplifiers 120, 320 which cannot be achieved through a single bank.

For example, amplifiers 120, 320 in each amplifier bank 114, 314 may have different and incompatible properties which render it necessary to separate the two banks 114, 314. Alternatively, there may be efficiency or switching time benefits in switching between amplifier banks 114, 314 rather than selecting particular amplifiers within a given bank 114, 314. Finally, the amplifier banks 114, 314 may provide redundancy against failure of components within the amplifier banks 114, 314.

A further advantage of the provision of multiple amplifier banks 114, 314 is that, optionally, the amplified signal can be sampled at an intermediate stage by the third, intermediate RF detector 318a. This data can be inputted to the controller 104 and utilised in combination with one or more of the input and output signal level samples to enable fine-tuning of the amplification of the signal. Therefore, the selection of amplifiers 120, 320 and properties of the amplifiers 120, 320 can be fine-tuned at an intermediate level so that any deviation from an expected or ideal level may be compensated for by the later amplifier stages 320.

Figure 4:
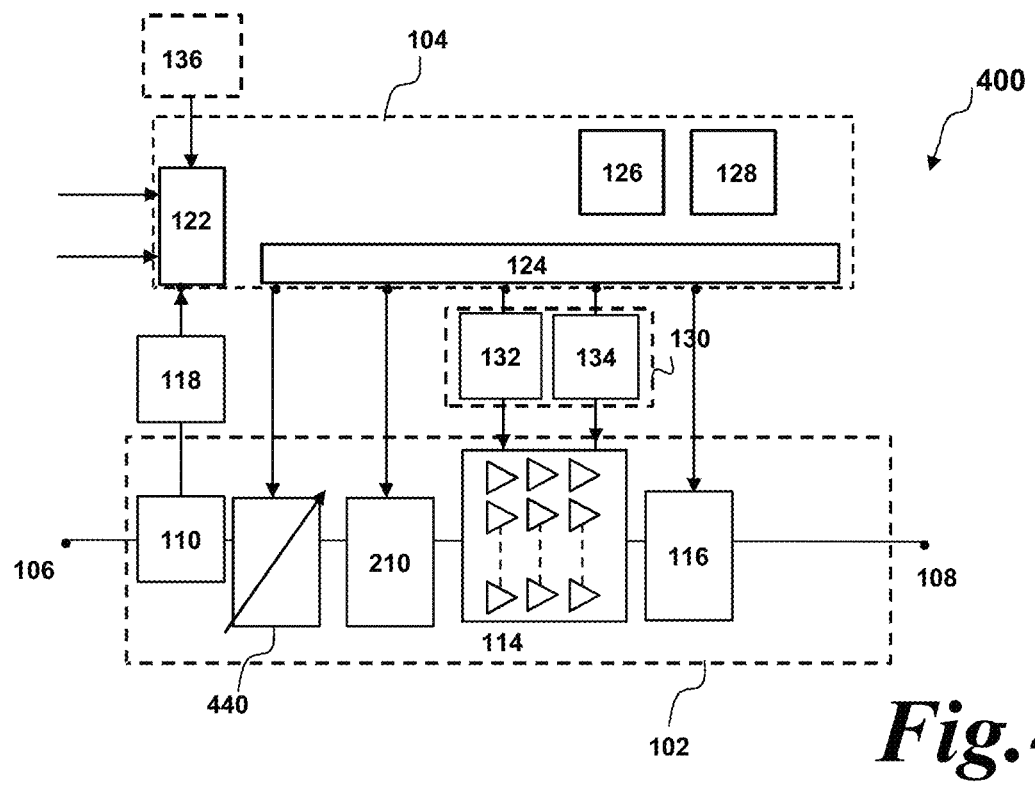
FIG. 4 is a functional block diagram of an RF amplifier arrangement according to a fourth embodiment of the present invention.
Figure 5:
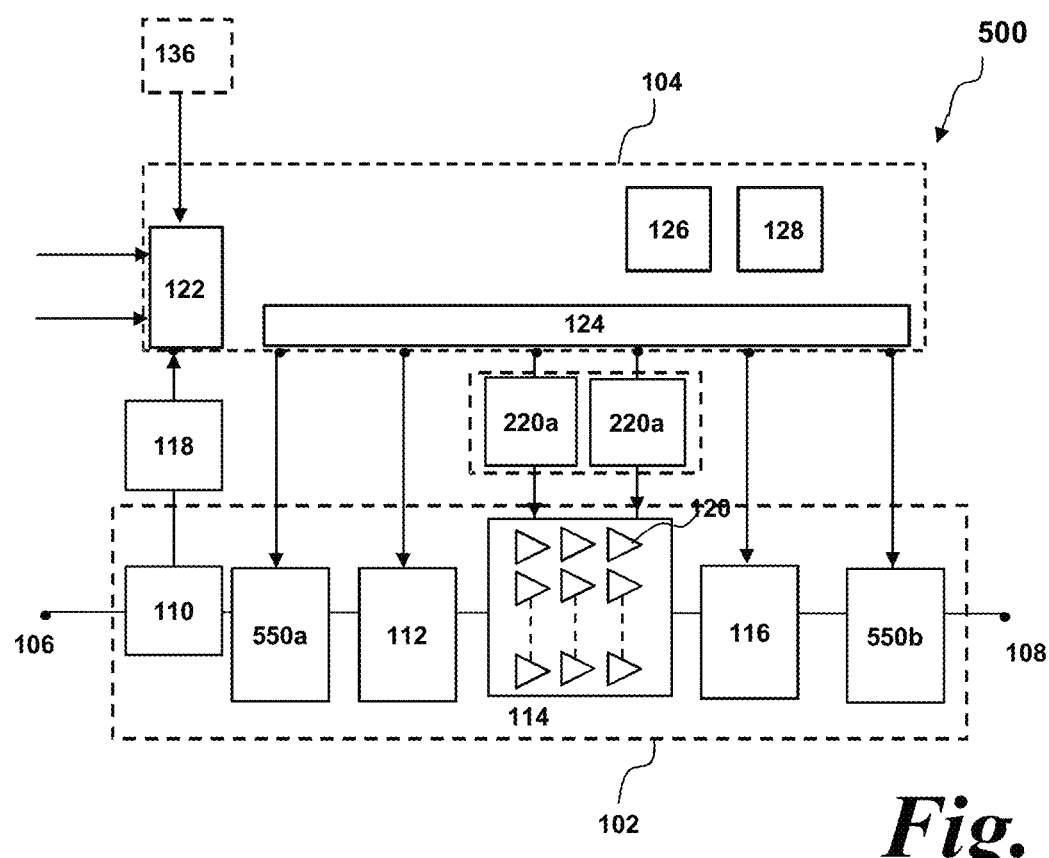
FIG. 5 is a functional block diagram of an RF amplifier arrangement according to a fifth embodiment of the present invention.
Figure 6:
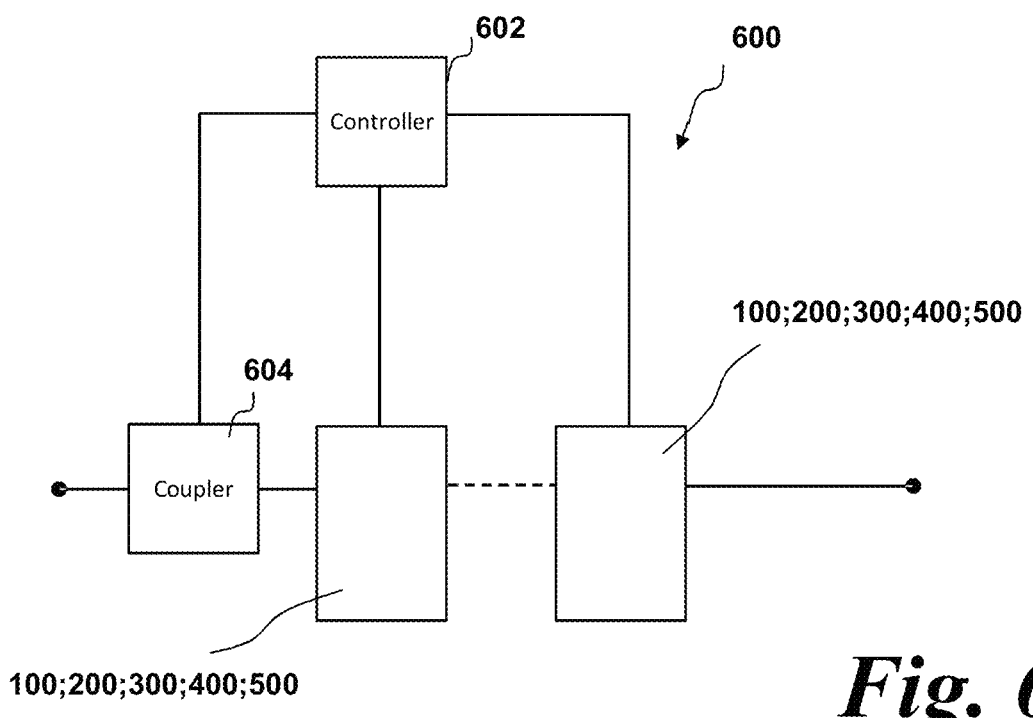
FIG. 6 is a functional block diagram of an RF amplifier arrangement according to a sixth embodiment of the present invention.

Further alternative embodiments are shown in FIGS. 4, 5 and 6.

FIG. 4 shows a fourth embodiment of the invention 400 similar to the first embodiment of the invention. However, in the fourth embodiment, an attenuator 440 is located in the signal path between the coupler 110 and the input switch network 112. In this embodiment, the variable attenuator 440 is operable to attenuate the input signal $S_i$ by a variable amount (for example, 3 dB). The attenuator 440 is connected to the output interface 124 of the controller 104. Therefore, the controller 104 is operable to control the level of attenuation of the input signal $S_i$ by the attenuator 440, or bypass the attenuator 440 altogether if required. The attenuator 440 can be implemented as distributive attenuator or as multiple discrete attenuators across the RF line up to provide further gain control with means to optimise NF versus linearity trade off.

By providing such a variable attenuator, a wide range of signal strengths can be accommodated such that a narrower range, or more specific set, of amplifiers may be used.

FIG. 5 shows a fifth embodiment of the invention 500 similar to the first embodiment of the invention. However, in the fifth embodiment, an input filter bank 550a and an output filter bank 550b is provided. The input filter bank 550a is located in the signal path between the coupler 110 and the input switch network 112. The output filter bank 550b is located in the signal path between the output switch network 116 and the output port 108.

In this embodiment, the filter banks 550a, 550b are connected to the output interface 124 of the controller 104. Therefore, the controller 104 is operable to control the level of filtration applied to the input signal Si prior to amplification and post-amplification. The controller 104 may select the most appropriate filters for the input signal. For example, the filter banks 550a, 550b may comprise a selection of different filters (not shown) which may be selected as appropriate by the controller 104. These may include band pass filters, low pass filters, high pass filters or a combination of filter types.

Therefore, by utilising a selection of filter elements based on the strength of the input signal and its characteristics, an improved output signal quality can be achieved. For example, background noise can be eliminated or, if a particularly weak signal is detected or multiple signals of different frequency are detected, a narrow band pass filter centred on the desired frequency can be employed to select the correct frequency prior to amplification. Further, any noise or unwanted distortion can be eliminated post-amplification by the filter bank 550b located downstream of the amplifier bank 114.

FIG. 6 shows a sixth embodiment of the present invention. In the sixth embodiment, multiple RF Amplifier arrangements are connected together to form a large scale RF amplifier arrangement 600. The RF amplifier arrangements 100, 200, 300, 400, 500 of the previous embodiments may be used in this embodiment such that more than one RF amplifier arrangement 100, 200, 300, 400, 500 is connected in a cascade arrangement. A common controller 602 may be utilised to control the grouped RF amplifier arrangements 100, 200, 300, 400, 500 based on at least a measured input signal obtained from a coupler 604.

Figure 7:
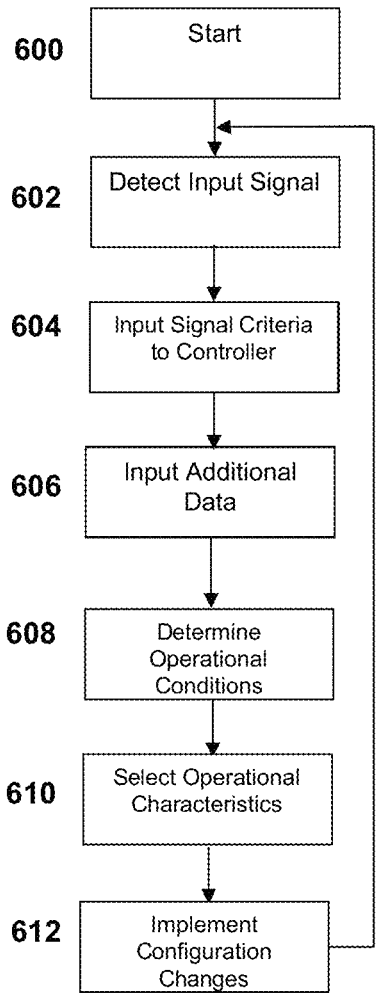
FIG. 7 shows a flow chart of a method according to an embodiment of the present invention.

A method of operation of the present invention will now be described with reference to FIG. 7.

Step 600: Start

At step 600 the RF amplifier arrangement 100, 200, 300, 400, 500 is initialised and the method is started. The method proceeds to step 602.

Step 602: Detect Input Signal

An input signal Si is received at the input port 104. The input signal Si has a particular signal amplitude and frequency distribution. The input signal Si is split in the coupler 110 and the RF detector 118 is utilised to detect the amplitude and frequency properties of the RF input signal Si.

Optionally, as described with reference to FIG. 1B, the input signal Si may be sampled to determine the signal level as a function of frequency. This information can then be used in subsequent steps to control dynamically and compensate for undesired slope effects.

The method proceeds to step 604.

Step 604: Input Signal Criteria to Controller

After the step of detection in step 300, the detected properties (e.g. signal strength/amplitude of a particular signal frequency) of the input signal $S_i$ are input into the controller 104 through the input interface 122.

The method proceeds optionally to step 606 or directly to step 608.

Step 606 (Optional): Input Additional Data to Controller

At step 606, further data may be input into the controller 104 prior to selection of the operational condition of the amplifier bank(s) 114, 314. In the case of the second embodiment, this data may include the detected properties (e.g. signal strength/amplitude of a particular signal frequency, frequency versus level characteristics) of the output signal $S_o$ which is inputted from the RF detector 216 through the input interface 122.

Alternatively, in the case of the third embodiment, the inputted data may also include signal data sampled at the intermediate stage (i.e. between amplifier banks 114 and 314) by the third, intermediate RF detector 318a.

Finally, environmental and electronic control data may be input the sensor module 136 (which may, for example, measure temperature, humidity, altitude or vibration) or from electrical feedback (e.g. power supply voltage or current in particular components).

Alternatively, such environmental and electrical data may be inputted remotely or locally to the controller 104 through the input interface 122. This may include manually- or automatically-input temperature values or other environmental parameters which are used to control the operation of the amplifier bank 114 (and amplifier bank 314 if present).

The method proceeds to step 608.

Step 608: Determine Operational Conditions of Amplifier Bank

At step 608 the data inputted in step 604, or in steps 302 and 304 is processed by the controller 104 to determine whether the operational conditions of the amplifier bank 114, 314 are suitable for the detected input signal strength.

The primary input to the controller 104 is the input signal strength. This may be the signal strength (i.e. amplitude) of a particular frequency of interest, or may be the signal strength of a broad range of frequencies selected as appropriate. However, other inputs may also be used as discussed above.

Based on the detected signal strength, the controller 104 determines the operational configuration and operating conditions of the amplifier bank 114 (and amplifier bank 314 if present).

In embodiments, for each input signal level (or discrete band of input signal levels) a particular configuration of amplifiers 120 within the amplifier module 102 may be chosen to optimise the properties of the amplifier module 102 for that particular input signal level or discrete band of input signal levels. As set out above, at low signal levels, minimising noise (i.e. minimising the overall Noise Figure of the amplifier module 102 between the input and the output) may be the dominant requirement for robust signal amplification.

Conversely, as the input signal level increases, then the linearity of the amplifier module 102 (i.e. the overall linearity of the entire amplification system between the input and the output) may become the dominant requirement. In between these levels, there is of course a trade-off between Noise Figure and linearity which can be obtained by selection of particular configurations of amplifiers 120 within the amplifier module 102.

By way of example, a minimum received input signal level may be in the range of −80 dBm to −90 dBm ($1 \times 10^{-12}$ W). Conversely, the input signal level may increase up to, for example, 40 dBm (10 W) in use. Consequently, the amplifier 100 is required to select appropriate operational configurations and operating conditions of the amplifier bank 114 (and/or amplifier bank 314) to amplify and output the received input signal with adequate quality and fidelity across a range of more than ten orders of magnitude.

For many suitable applications, at low signal levels a very low Noise Figure value such as sub 1 dB is typically required. Conversely, at high signal levels the amplifier needs to be highly linear to minimise effects of distortion and maintain good fidelity in the output signals with 1 dB Gain Compression Points (GCP) typically in the region of 10 W.

In one embodiment, the operational conditions may be determined by comparing the detected signal strength with values stored in a look up table (LUT) stored in the local memory 128. The LUT may comprise particular values or transition points at which particular amplifiers 120 are switched in or out of the signal path or their operational parameters modified.

The LUT may describe, for a given signal strength, which amplifiers 120 are to be operational in the signal path and their operating characteristics, e.g. quiescent points, bias and position in the signal path (e.g. cascading or in parallel).

If step 606 is carried out, then in one embodiment the LUT may also comprise configuration data for particular values of the intermediate and output signal strengths, or environmental/electronic parameters in combination with the input signal strength.

Alternatively, the LUT 128 may comprise values which relate solely to the input signal strength, with a perturbation being applied downstream in response to environmental/electrical data and/or additional signal strength measurements.

As a further alternative, a LUT is not required and the input signal strength may be processed utilising one or more comparators operable to compare the detected input signal strength predefined thresholds to define particular configurations of operational amplifier setting.

The same principle may be applied to other parameters such as the environmental/electrical characteristics and any additional RF signal sampling which may be carried out in addition to the sampling of the input signal strength.

If, at step 608, the controller 104 determines that the operational conditions of the amplifier bank(s) 114, 314 are suitable for the measured input signal strength, then the method returns to step 300 and continues to monitor and detect the input signal strength.

However, if the controller 104 determines that the input signal strength has changed such that the operational conditions of the amplifier bank(s) 114, 314 are not suitable for the measured input signal strength, then the method proceeds to step 610.

Step 610: Select Operational Characteristics of the Amplifier Bank(s)

At step 610, it has been determined (at step 608) that the operational characteristics of the amplifier bank(s) 114, 314 need to be changed in order to suit better the desired performance of the amplifier arrangement and provide the desired output.

Depending upon the configuration of the RF Amplifier arrangement 100, 200, 300, 400, 500, this may be done in multiple ways as set out below:

1) Configure Switch Networks

The controller 104 is arranged to control the input switch network 112 and output switch network 116 (and the intermediate switch network 316a if present) in order to define a particular configuration of amplifier stages 120, 320 within the amplifier bank(s) 114, 314.

This configuration may be pre-defined by the LUT, may be pre-defined in hardware (e.g. by selection of particular hardware configurations using, for example, comparators) or may be inputted to the controller 104 through the input interface 122 remotely or locally by a user or automatically.

The selected arrangement of amplifier stages 120, 320 may be any suitable configuration. For example, particular amplifier stages 120, 320 may be preferentially selected due to their suitable characteristics for a particular input signal strength. For example, when the detected input signal strength is strong the selected amplifier stages 120, 320 may be higher linearity components with stronger DC bias conditions and/or high OIP3 values. Conversely, when the detected input signal strength is low the selected amplifier stages 120, 320 may be gently biased active amplifier devices, e.g. transistors to lower the Noise Figure (NF).

Different configurations of amplifier stages 120, 320 are also possible using the switch networks 112, 116, 116a so that amplifier stages 120, 320 may be connected in parallel, in a bridge configuration or in a cascade configuration as required.

2) Configure Amplifier Stage Properties

Alternatively or additionally, the controller 104 is further arranged to control the operating properties of the amplifier stages 120, 320 directly. For example, the controller 104 may be operable to change properties of the individual amplifier stages 120, 320 such as the quiescent points of the semiconductor devices, the bias applied to these devices.

3) Configure Additional Devices

As set out in the fourth, fifth and sixth embodiments shown in FIGS. 4 to 6, additional devices such as attenuators 440 and filter banks 550a, 550b may also be controlled by the controller 104. In addition, slope control circuits (not shown) may also be provided and controlled by the controller 104 as appropriate.

For example, the controller 104 may determine that the amplifier stages 120, 320 as currently configured are suitable for a particular input signal strength provided that the input signal strength is attenuated by a predetermined amount.

Alternatively, if the input signal characteristics desire, selection of an appropriate bandpass filter may remove extraneous noise such that a particular configuration of amplifier stages 120, 320 may be used that otherwise could not.

Whilst the presence of such additional elements as filter banks 550a, 550b, attenuators 440 and/or slope control functions is optional in particular embodiments, the provision of these devices enables a wide and flexible range of amplifier configurations to be used.

Based on at least the input signal strength as measured at step 300 and input at step 604 (and other parameters detected at step 606 if required), a particular configuration of device set up is selected by the controller 104 and implemented at step 612 below.

Step 612: Implement Configuration Changes

At step 612, the changes and/or desired configuration defined in step 610 are implemented.

The controller 104, via the output interface 124, sends respective control signals to the switch networks 112, 116, 316a and to any other devices (e.g. amplifier stages 120, 320, filter banks 550a, 550b or attenuators 440) requiring control.

When the devices are switched, this may result in undesirable switching characteristics in the output signal So. To reduce such effects, one of at least two intermediate techniques are applied.

Figure 8:
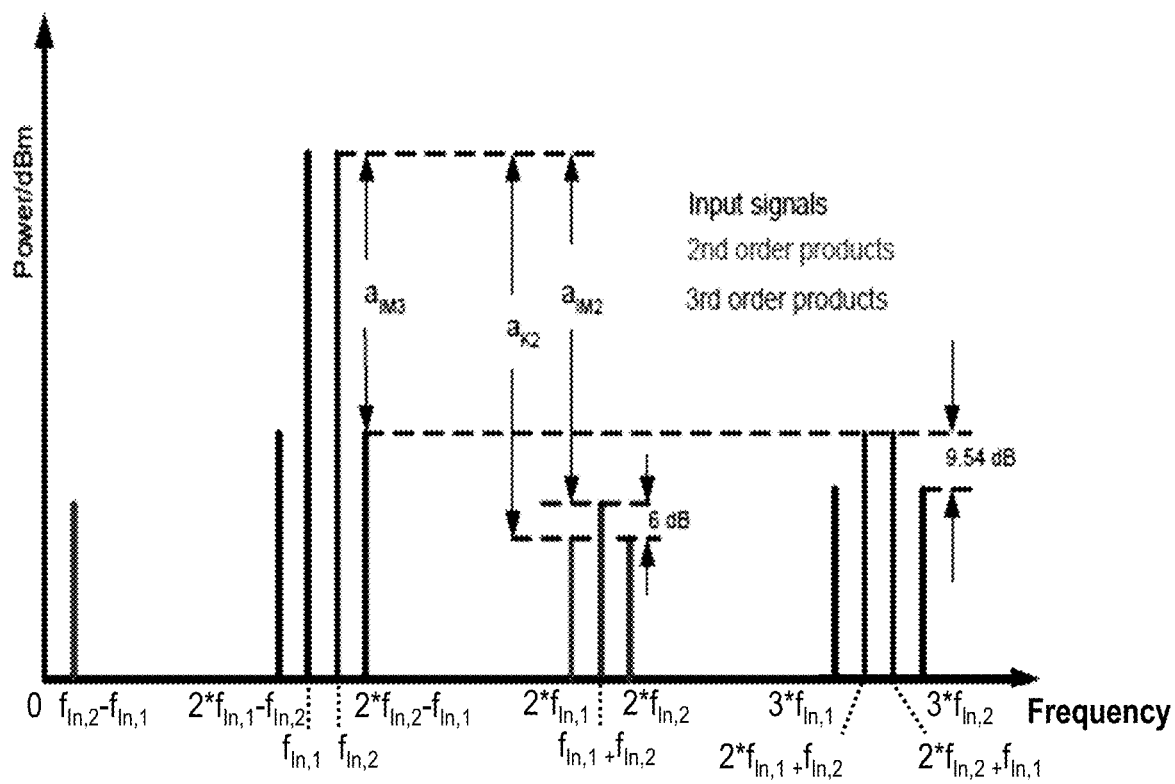
FIG. 8 shows a graph of power in dBm as a function of frequency illustrating the second and third order products of an input signal.
Figure 9:
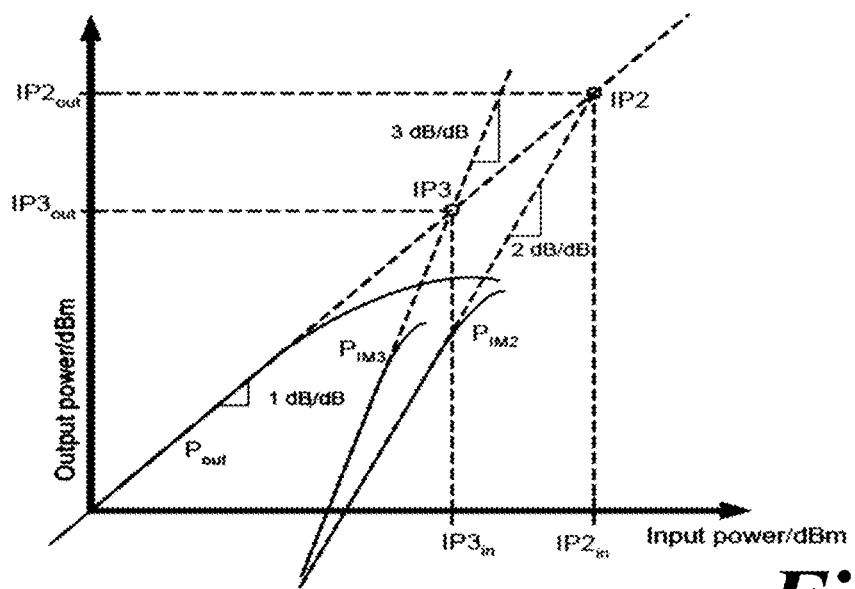
FIG. 9 shows a graph of output power (in dBm) as a function of input power (in dBm) illustrating the intermodulation product.

For most applications, a dynamic hysteresis function will be built in to the switchover process to avoid jitters when changing operational mode. The hysteresis can be pre-defined value or operator controlled parameter. It will define the gap between respective states of the dynamically controlled RF amplifier. For example, if the amplifier is programmed to change from low noise characteristics state 1 to high linearity characteristics state 2 when an input level goes below −20 dBm, it will revert back to state 1 only when this threshold is exceeded by 10 dB. See FIG. 8 for a simplified example of application of the described hysteresis.

Additionally or alternatively, a time constant or delay functions can be implemented to minimise glitches in signal transmission through the amplifier stages 120, 320 when there is a transition between different operational modes. As a further alternative, additional processing or smoothing of the signal may be carried out.

When reconfigured, the RF amplifier arrangement 100, 200, 300, 400, 500 is operable to function across a different dynamic range in response to the measured signal strength.

The method then proceeds back to step 602 where the input signal strength is monitored.

In summary, the present invention provides multiple schemes for effective broadening of the dynamic range of an RF amplifier. In all cases, the detected signal is sampled, processed and then the characteristics of the RF line-up are changed. The dynamic implementation of these changes extends the operational power range of the amplifier well beyond known arrangements.

As set out above, the detection is by sampling of the signal at the input port. In addition, the signal may be sampled at the output, intermediate, or at multiple points. It is most commonly sampled at the input port as this offers further advantages. However, if slope correction is required, it is often necessary to sample both the input and output signals.

These sampled signals are then used to define the changes to the amplifier characteristic, either by operating a switch network, or changing the quiescent points of the semiconductor devices used as building blocks in the construction of the amplifier equipment. The control circuit will then implement the changes by switching between devices, or their bias conditions, or a combination of the two. This is to enable extension of the operational dynamic range. An example is where there is a bank of amplifier devices which are dynamically selected depending on the nature of the sampled input signal.

This selection process can be adapted over the different components of the amplifier line-up to optimise it for the intended application. Sampled signals over the intermediate stages can be used to fine tune the adaptive optimisation process.

In addition, the controller 104 may be operable to measure and collate data on the operational conditions of the amplifier module 102 including electrical and environmental data, and this data can be used dynamically to optimise the operation of the amplifier. This optimisation may, as discussed above, involve changes to the electrical behaviour of the electronic building blocks of the amplifier, as well as switching between alternative components and varying their electrical characteristics to suit to the intended application. In summary, the present invention provides an arrangement which is operable to optimise and extend the dynamic range of the amplifier apparatus.

Variations on the above embodiments could be made. For example, the amplifiers shown in FIGS. 1A to 6 could be amplifiers of different topologies including single ended arrangement, quadrature balanced (comprising two amplifiers 90 degrees apart in phase) or balanced in a 180-degree, anti-phase combining arrangement. The latter case commonly serves the purpose of improving even order intermodulation products and OIP2, and the former serves to improve odd order intermodulation products and OIP3.

Embodiments of the present invention have been described with particular reference to the examples illustrated. While specific examples are shown in the drawings and are herein described in detail, it should be understood, however, that the drawings and detailed description are not intended to limit the invention to the particular form disclosed. It will be appreciated that variations and modifications may be made to the examples described within the scope of the present invention.

The invention claimed is:

1. An RF amplifier arrangement comprising:
an input operable to receive an RF input signal;
an output operable to output an amplified RF signal;
a first amplifier bank located between the input and output, the first amplifier bank comprising a plurality of amplifier stages;
an input level detector operable to measure a signal level of the RF input signal;
a controller operable to control the first amplifier bank, wherein the controller is operable to select one or more configurations of the amplifier stages by selecting one or more of the amplifier stages and/or modifying one or more characteristics of the amplifier stages in dependence upon the signal level of the RF input signal, wherein the controller is operable to apply slope correction to the RF input signal; and
a first switch network configured to selectively connect the amplifier stages of the first amplifier bank to define the configurations; wherein the controller is operable to cause the switch network to select one or more of the configurations in dependence upon the signal level of the RF input signal.

2. An RF amplifier arrangement according to claim 1, wherein each of the configurations of the amplifier stages corresponds to a particular signal level or a band of the signal level.

3. An RF amplifier arrangement according to claim 2, wherein each of the configurations is configured to minimise a Noise Figure of the first amplifier bank and/or to maximise linearity characteristics of the first amplifier bank.

4. An RF amplifier arrangement according to claim 2, wherein the configurations is selected utilising pre-determined thresholds and/or comparators.

5. An RF amplifier arrangement according to claim 2, wherein when the signal level of the RF input signal diverges from the particular signal level or band of the RF input signal for one of the configurations, the controller is operable to switch the RF amplifier arrangement to a different one of the configurations.

6. An RF amplifier arrangement comprising:
an input operable to receive an RF input signal;
an output operable to output an amplified RF signal;
a first amplifier bank located between the input and output, the first amplifier bank comprising a plurality of amplifier stages;
an input level detector operable to measure a signal level of the RF input signal; and
a controller operable to control the first amplifier bank, wherein the controller is operable to select one or more configurations of the amplifier stages by selecting one or more of the amplifier stages and/or modifying one or more characteristics of the amplifier stages in dependence upon the signal level of the RF input signal, wherein the controller is operable to apply slope correction to the RF input signal,
wherein each of the configurations of the amplifier stages corresponds to a particular signal level or a band of the signal level;
wherein when the signal level of the RF input signal diverges from the particular signal level or band of the RF input signal for one of the configurations, the controller is operable to switch the RF amplifier arrangement to a different one of the configurations; and
wherein the controller is operable to avoid jitter effects by applying a dynamically controlled hysteresis function to at least some of the amplifier stages.

7. An RF amplifier arrangement comprising:
an input operable to receive an RF input signal;
an output operable to output an amplified RF signal;
a first amplifier bank located between the input and output, the first amplifier bank comprising a plurality of amplifier stages;
an input level detector operable to measure a signal level of the RF input signal; and
a controller operable to control the first amplifier bank;
wherein the controller is operable to select one or more configurations of the amplifier stages by selecting one or more of the amplifier stages and/or modifying one or more characteristics of the amplifier stages in dependence upon the signal level of the RF input signal; wherein the controller is operable to apply slope correction to the RF input signal;
wherein each of the configurations of the amplifier stages corresponds to a particular signal level or a band of the signal level;
wherein the configurations is selected utilising pre-determined thresholds and/or comparators; and
wherein the controller is operable to apply a time delay to the RF input signal during a transition between the configurations.

8. An RF amplifier arrangement according to claim 1, wherein the one or more of the amplifier stages selected by the controller are connected in parallel or in a cascading arrangement.

9. An RF amplifier arrangement according to claim 1, wherein at least some of the amplifier stages have different characteristics selected from the group consisting of Noise Figure and linearity point.

10. An RF amplifier arrangement according to claim 1, wherein the controller is operable to select the one or more configurations by modifying one or more characteristics of the amplifier stages, the characteristics being selected from the group consisting of quiescent point and bias of the amplifier stages.

11. An RF amplifier arrangement comprising:
an input operable to receive an RF input signal;
an output operable to output an amplified RF signal;
a first amplifier bank located between the input and output, the first amplifier bank comprising a plurality of amplifier stages;
an input level detector operable to measure a signal level of the RF input signal;
a controller operable to control the first amplifier bank, wherein the controller is operable to select one or more configurations of the amplifier stages by selecting one or more of the amplifier stages and/or modifying one or more characteristics of the amplifier stages in dependence upon the signal level of the RF input signal, wherein the controller is operable to apply slope correction to the RF input signal; and an output level detector operable to detect a signal level of the amplified RF signal, wherein the controller is further operable to select one or more from the configurations in dependence upon the signal level of the amplified RF signal.

12. An RF amplifier arrangement according to claim 1, further comprising a second amplifier bank comprising a plurality of amplifier stages.

13. An RF amplifier arrangement according to claim 12, further comprising a second switch network.

14. An RF amplifier arrangement comprising:
an input operable to receive an RF input signal;
an output operable to output an amplified RF signal;
a first amplifier bank located between the input and output, the first amplifier bank comprising a plurality of amplifier stages;
an input level detector operable to measure a signal level of the RF input signal;
a controller operable to control the first amplifier bank, wherein the controller is operable to select one or more configurations of the amplifier stages by selecting one or more of the amplifier stages and/or modifying one or more characteristics of the amplifier stages in dependence upon the signal level of the RF input signal, wherein the controller is operable to apply slope correction to the RF input signal;
a second amplifier bank comprising a plurality of amplifier stages; and
an intermediate detector operable to detect a signal level of an intermediate amplified signal between the first amplifier bank and the second amplifier bank; wherein the controller is further operable to select the one or more configurations in dependence upon the intermediate amplified signal.

15. An RF amplifier arrangement according to claim 1, further comprising an environmental detector operable to measure one or more of: temperature, humidity, altitude, and vibration.

16. An RF amplifier arrangement according to claim 1, wherein the input level detector is operable to measure the signal level of the RF input signal at one or more discrete frequencies and/or one or more discrete frequency bands.

17. An RF amplifier arrangement according to claim 16, wherein the input level detector is operable to select the one or more discrete frequencies and/or the one or more discrete frequency bands and to determine the signal level of the RF input signal thereat.

18. An RF amplifier arrangement comprising:
an input operable to receive an RF input signal;
an output operable to output an amplified RF signal;
a first amplifier bank located between the input and output, the first amplifier bank comprising a plurality of amplifier stages;
an input level detector operable to measure a signal level of the RF input signal; and
a controller operable to control the first amplifier bank, wherein the controller is operable to select one or more configurations of the amplifier stages by selecting one or more of the amplifier stages and/or modifying one or more characteristics of the amplifier stages in dependence upon the signal level of the RF input signal, wherein the controller is operable to apply slope correction to the RF input signal, wherein the input level detector is operable to measure the signal level of the RF input signal at one or more discrete frequencies and/or one or more discrete frequency bands, select the one or more discrete frequencies and/or the one or more discrete frequency bands and determine the signal level of the RF input signal thereat, wherein the input level detector comprises a local oscillator operable to generate a predetermined frequency and a mixer operable to output either a summed frequency of the local oscillator and the RF input signal or a frequency difference between the local oscillator and the RF input signal, to select the one or more discrete frequencies or frequency bands.

19. An RF amplifier arrangement according to claim 18, wherein the input level detector further comprises a band-pass filter.

20. An RF amplifier arrangement according to claim 18, wherein the local oscillator is operable to generate one or more frequencies.

21. An RF amplifier arrangement according to claim 1, wherein the input level detector is operable to measure the signal level of the RF input signal at one or more discrete frequencies and/or one or more discrete frequency bands; wherein the slope correction is determined based upon the signal level of the RF input signal at the one or more discrete frequencies and/or the one or more discrete frequency bands.

* * * * *